United States Patent [19]

Ono et al.

[11] 4,450,031
[45] May 22, 1984

[54] ION SHOWER APPARATUS

[75] Inventors: Toshiro Ono; Seitaro Matsuo, both of Isehara, Japan

[73] Assignee: Nippon Telegraph & Telephone Public Corporation, Tokyo, Japan

[21] Appl. No.: 530,424

[22] Filed: Sep. 8, 1983

[30] Foreign Application Priority Data

Sep. 10, 1982 [JP] Japan ............................. 57-156842
Oct. 4, 1982 [JP] Japan ............................. 57-173270

[51] Int. Cl.³ .................... C23F 1/02; C03C 15/00; B44C 1/22; H01L 21/306
[52] U.S. Cl. .................................. 156/345; 118/728; 118/50.1; 118/620; 156/643; 156/646; 204/298
[58] Field of Search ..................... 156/345, 643, 646; 204/192 R, 192 C, 192 EC, 192 S, 192 E, 298; 427/38, 39; 118/715, 728, 50.1, 50, 620

[56] References Cited

U.S. PATENT DOCUMENTS 4,233,109 11/1980 Nishizawa ..................... 156/345 X
4,243,506 1/1981 Ikeda et al. .................... 156/345 X
4,259,145 3/1981 Harper .......................... 156/643

OTHER PUBLICATIONS

Low Energy Ion Beam Etching, J. M. E. Harper et al., pp. 1077–1083, J. Electrochem. Soc.:Solid-State Science and Technology, vol. 128, No. 5, May 1981.
Ion Milling for Semiconductor Production Processes, Dr. L. D. Bollinger, pp. 66–70, Nov. 1977/Solid State Technology.
Ion Beam Divergence Characteristics of Two-Grid Accelerator Systems, G. Aston et al., pp. 516–524, AIAA Journal, vol. 16, No. 5, May 1978.

Primary Examiner—William A. Powell
Attorney, Agent, or Firm—Cushman, Darby & Cushman

[57] ABSTRACT

An ion shower apparatus comprising a plasma formation chamber in which plasma is produced so as to produce ions, a single ion extraction grid disposed in one portion of the plasma formation chamber and for extracting the ions from the plasma formation chamber so as to form an ion beam in the form of shower, a specimen chamber in which the surface of a specimen subjected to etching or deposition or a target subjected to sputtering is irradiated with the ion beam in the form of shower, and a shield grid disposed in the vicinity of the ion extraction grid in the plasma formation chamber and spaced apart from the thickness of the plasma sheath produced over the ion extraction grid, in a manner that the shield grid permits the passage of the plasma therethrough and prevents the electric field produced by the ion extraction grid substantially from extending to the remaining region of the plasma formation chamber. The ion extraction grid is not damaged. An ion beam with a high current is obtained stably.

9 Claims, 18 Drawing Figures

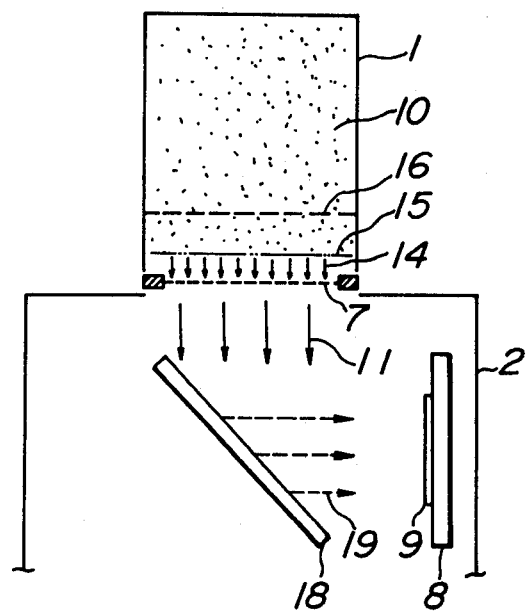

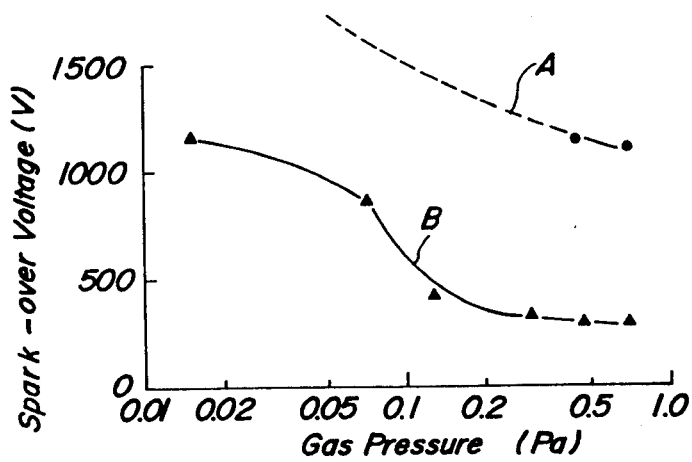
FIG_7
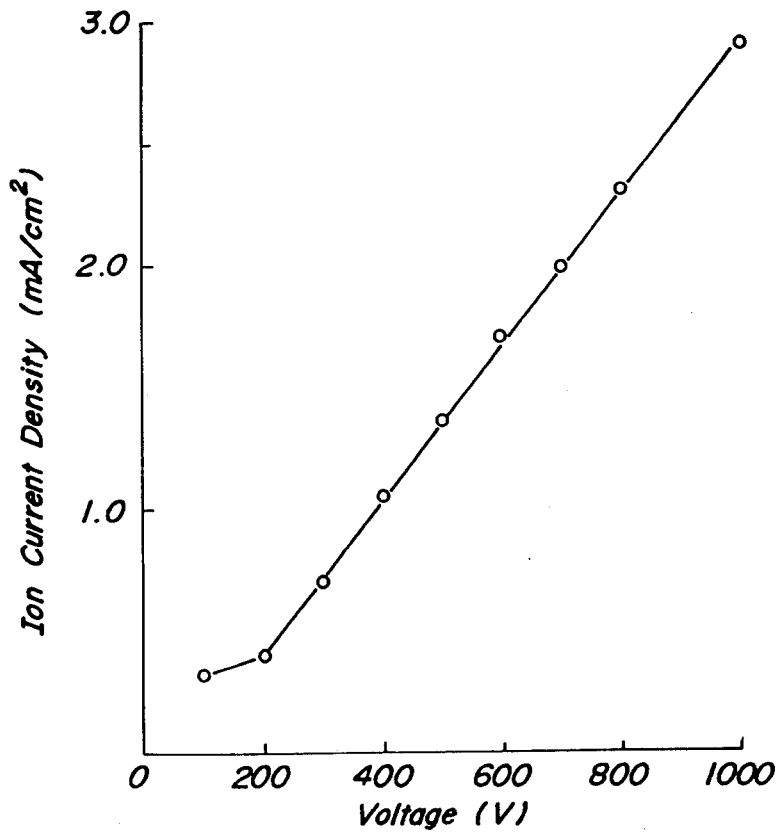
FIG_8

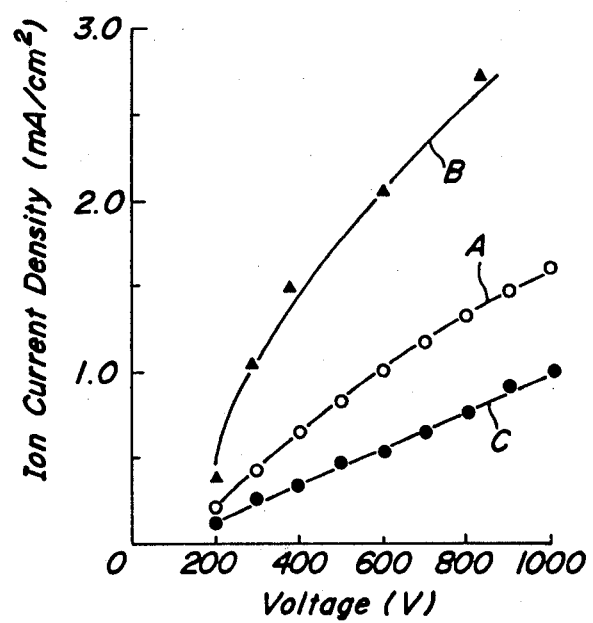
FIG_17

ION SHOWER APPARATUS

BACKGROUND OF THE INVENTION

1. Field of the Invention

The present invention relates to an ion shower apparatus for use in the process of etching fine patterns in the manufacture of semiconductor devices, for use in the process of sputtering a target by an ion current, for use in the process of ion beam deposition on a specimen surface of the like.

2. Description of the Prior Art

The ion shower apparatus of the type described above comprises, in general, a plasma formation chamber for producing a plasma producing ions; ion extraction grids so disposed as to partially define the plasma formation chamber thereby extracting the ions from the plasma formation chamber so as to produce an ion beam in the form of a shower (to be referred to as "a shower-like ion beam" in this specification) and a specimen chamber in which the surface of a specimen is irradiated with the shower-like ion beam. Such an ion shower apparatus is widely used in the manufacture of semiconductor devices by using an ion etching or reactive ion etching method, an ion beam sputtering method or an ion beam deposition method.

FIG. 1 shows a Kaufman type ion shower apparatus which has been widely used. Such an apparatus is disclosed in detail, for example, in "Ion Milling for Semiconductor Production Processes", L. D. Bollinger; Solid State Technology, Nov., pp. 66–70 (1977). In FIG. 1, reference numeral 1 designates a plasma formation chamber; 2, a specimen chamber; 3, a thermionic cathode; 4, an anode; 5, an etching gas inlet; 6 and 7, an upper and a lower ion extraction electrode or grid; 8, a specimen or substrate table; 9, an object to be subjected to etching, deposition or sputterring, for example, a specimen or substrate; 10, plasma; 11, a shower-like ion beam; 12, a solenoid magnet; and 13, a mask.

In operation, an etching gas is introduced through the inlet 6 into the plasma formation chamber 1 and is ionized by electrones accelerated from the thermionic cathode 3 to the anode 4. The solenoid magnet 12 is used to increase an ionization efficiency.

Each of the ion extraction electrodes or grids 6 and 7 has a plurality of apertures having a diameter of 2–3 mm and a high potential (for instance, 1000 V) is applied to the plasma formation chamber 1 and to the upper electrode 6, while the lower electrode 7 is grounded. The boundary of the plasma sheath is defined in the vicinity of the upper ion extraction grid 6 by the grid 6. The ionized etching gas in the plasma 10 flows into the sheath boundary and is then accelerated by the electric field in the plasma sheath, so that the ionized etching gas is extracted to the specimen chamber 2. As a result, in case that the shower-like ion beam 11 is used for the purpose of etching, the shower-like ion beam 11 impinges against the specimen or substrate 9 on the table 8, so that the surface of the specimen or substrate 9 which is not covered by the mask 13 is physically or physio-chemically etched. Further, the mask 13 is to be selected from materials which do not react with the shower-like ion beam 11.

The dimensions of the two ion extraction grids 6 and 7 and the ion beam convergence at these grids are discussed in detail in "Ion Beam Divergence Characteristics of Two-Grid Accelerator Systems", by G. Aston et al., AIAA JOURNAL, Vol. 16, No. 5, pp. 516–524.

FIG. 2 shows an ion source of a prior art ion shower apparatus of the type in which plasma is produced by electron cyclotron resonance excited by microwave. The construction of the apparatus is disclosed in detail in Japanese Patent Application No. 61,409/1981. In FIG. 2, reference numeral 21 denotes a plasma formation chamber; 22, a specimen chamber; 23, an ion extraction grid assembly having an upper floating electrode or grid 23A and a lower ion extraction grid 23B; 24, a microwave introducing window made of fused quartz; 25, a rectangular waveguide; 26, a magnetic coil; 27, 28 and 29, insulators; 30 and 31, magnetic shield members with a high permeability; 32, a gas inlet; 33, a microwave reflector; 34, a microwave coupling window; 35, an insulating spacer; and 36, a plasma transport chamber.

When the ion source shown in FIG. 2 is operated, first, a gas is introduced through the gas inlet 32 to the plasma formation chamber 21, while the microwave is introduced into the plasma formation chamber 21 through the rectangular waveguide 25, the microwave introducing window 23 and the microwave coupling window 34. At the same time, the magnet coil 27 produces a magnetic field which satisfies a condition of electron cyclotron resonance at least at one portion in the plasma formation chamber 21, so that plasma is produced in the plasma formation chamber 21. In order that the microwave power is efficiently absorbed by the plasma, the plasma formation chamber 21 is in the form of a cavity resonator in which the microwave reflector 33 is disposed, and the size and shape of the microwave reflector 33 is so selected that the microwave is reflected back by the microwave reflector 33 but the plasma can freely pass through the reflector 33 toward the plasma transport chamber.

In order to extract the shower-like ion beam 11 from the plasma formation chamber 21 and the plasma transport chamber 36 toward the specimen chamber 22, a positive potential is applied to the plasma formation chamber 21 and the lower ion extraction grid 23B of the ion extraction grid assembly 23 is grounded, while the upper ion extraction grid 23A is electrically floated. The insulating spacer 35 is provided so that the upper ion extraction grid 23A is electrically floated, and the insulators 27 and 28 are provided in order to apply a potential to the plasma formation chamber 21. The upper ion extraction electrode 23A is floated, so that a negative potential is induced in a self-regulation manner depending upon the electron energy in the plasma. As a result, the number of incident electrons is considerably reduced, so that the upper and lower ion extraction grids 23A and 23B are prevented from being heated and at the same time an abnormal discharge is suppressed. The magnetic shield member 31 with a high permeability covers the top and the outer periphery of the magnet coil 27 so that a diverging magnetic field which is gradually weakened toward the lower ion extraction grid 23B is produced within the plasma formation chamber 21, whereby an ion extraction efficiency can be improved.

According to Child's law, the relationship between an ion current density (J) of the ion current extracted from the plasma formation chamber 21 to the specimen chamber 22 and a voltage (V) applied between the plasma formation chamber 21 and the ion extraction grid assembly 23 may be approximated as follows:

$$J \propto V^{3/2} l^{-2}$$

,where l is a distance between the ion extraction grids 6 and 7 or 23A and 23B. In the case of the ion shower apparatus of the type as shown in FIG. 1 or 2, the diameter of the ion extraction grids 6 and 7 or 23A and 23B is equal to or greater than that of the shower-like ion beam. The diameter is, in general, from 4 to 10 inches. In order that a uniform distance or gap may be maintained between the two ion extraction grids having such a large diameter as described above, the distance between the two grids is maintained to be 1 mm through 3 mm because thermal deformations must be taken into consideration. Therefore, it follows that in order to obtain the current density J which can attain a practical etching rate, a potential applied between the two ion extraction grids must be increased.

For instance, in case that the ion shower apparatus as shown in FIG. 2 is used for etching, when carbon fluoride gas (such as $C_2F_6$, $C_4F_8$) is introduced through the inlet 32 into the ion shower apparatus so as to etch an $SiO_2$ film and when the voltage applied between the plasma formation chamber 21 and the grid 23B is 1000 V, a high etching rate of $SiO_2$ film is obtained and a relatively high ratio of the etching rate of $SiO_2$ film to an etching rate of Si is obtained. But, if the voltage applied between the plasma formation chamber 21 and the grid 23B is less than 500 V, the etching rate of a $SiO_2$ film and the ratio of the etching rate of a $SiO_2$ film to the etching rate of other material are low, which are not satisfactory in practice.

If the voltage applied between the two grids is increased for extracting ions for etching, a satisfactory etching rate and a satisfactory etching rate ratio can be obtained, but abnormal discharge tends to occur between the grids. As a result, ions extracted by a high potential damages crystal structures on the surface being etched so that the functions of the semiconductor devices are degraded. Thus, the ion shower apparatus with a two grid system has a disadvantage in that its application range is limited. There are also other disadvantages in that a pertinent ion current cannot be extracted in case of ion beam sputtering by introducing an Ar gas to the ion shower apparatus and in that it is difficult to determine a low voltage which is preferable to an ion beam deposition process. In addition, there is a disadvantage in that there is involved a difficult work of disposing and securing two grids in such a way that their apertures are correctly aligned or registered with each other. Moreover, it is difficult to obtain a uniform ion shower with a large diameter.

FIG. 3 schematically shows an ion source of an ion shower apparatus of the type in which only one ion extraction grid is used. That is, the upper grid of the ion shower apparatus as shown in FIG. 2 is eliminated. Such an ion shower apparatus is disclosed in detail in "Low Energy Ion Beam Etching", by J. M. E. Harper et al.; J. Electrochem. Soc., Vol. 128, No. 5, pp. 1077-1083 (1981). In FIG. 3, the same reference numerals as in FIG. 1 are used to designate the corresponding parts of the ion shower apparatus as shown in FIG. 1 are used to designate similar parts. It is seen in FIG. 3 that the upper ion extraction electrode 6 is eliminated. Reference numeral 14 designates a plasma sheath and 15, a sheath surface. In this apparatus, a plasma sheath is produced in a self-regulation manner and an ion beam is produced by the electric field in the plasma sheath. The sheath surface 15 is formed at the position at which the upper ion extraction grid 6 as shown in FIG. 1 is disposed and the thickness of the plasma sheath 14 corresponds to the distance l between the upper and lower ion extraction grids 6 and 7 as shown in FIG. 1. That is, the plasma sheath 14 acts as an imaginary upper ion extraction grid. The thickness of the plasma sheath 14 is dependent on the voltage applied to the ion extraction grid 7. For instance, when the applied voltage is 100 V, the thickness of the plasma sheath 14 is in the order of 0.1-0.2 mm. Therefore, as Child's law indicates, there exists an advantage that a high current density can be obtained even at a low potential.

However, in the ion shower apparatus shown in FIG. 3, when a potential is applied to the ion extraction grid 7, the electric field thus produced is extended into the whole plasma formation chamber 1 so that the discharge electric field established between the thermionic cathode 3 and the anode 4 for producing the plasma is considerably disturbed. As a result, abnormal discharges such as spark discharge tends to occur very frequently, and accordingly plasma cannot be sustained in a stable manner. Furthermore, according to Paschen's law, a spark-over occurs between the ion extraction grid 7 and particular a portion of the wall of the plasma formation chamber 1, so that a stable ion beam cannot be produced when a high potential higher than 100-200 V is applied to the ion extraction grid 7. Therefore, as compared with the ion shower device with a two-grid system as shown in FIG. 1, a practical etching rate, a good etching rate ratio of the etching rate to an etching rate of other material, and an ion current suitable for ion beam sputtering cannot be attained, even though the current density can be increased at a potential less than 100-200 V.

In addition, in order to produce a shower-like ion beam with a high degree of directivity, the diameter of the apertures of the ion extraction grid 7 is made substantially equal to the thickness (0.1-0.2 mm) of the plasma sheath. Consequently, the ion extraction grid 7 must be machined or fabricated with a high degree of accuracy, so that it is difficult to use the ion extraction grid 7 in practice. Furthermore, the size of the rim forming the ion extraction grid 7 must be substantially equal in dimension to or less than the fine apertures thereof, so that the ion extraction grid 7 is easily subjected to thermal damage. Consequently, there is a disadvantage in that a high current cannot be extracted.

SUMMARY OF THE INVENTION

With the above in view, the present invention was made to overcome the above and other problems encountered in prior art ion shower apparatuses.

It is, therefore, one of the objects of the present invention to provide an ion shower apparatus which can prevent damage to an ion extraction grid, whose operation is not limited by a voltage applied to the ion extraction grid and which can obtain a stable ion beam with a high current.

It is another object of the present invention to provide an ion shower apparatus which can etch various materials of semiconductor devices without causing any damage to them with a satisfactory etching rate and a satisfactory etching selectivity.

It is a further object of the present invention to provide an ion shower apparatus which can obtain stably an ion current suitable for ion beam sputtering.

It is still a further object of the present invention to provide an ion shower apparatus which is widely applicable to ion beam deposition in which a relatively low voltage is used as well as ion beam sputtering, ion etching and reactive ion etching in which a relatively high voltage is used.

To the above and other ends, the present invention provides an ion shower apparatus comprising a plasma formation chamber in which a plasma is produced so as to produce ions; a single ion extraction grid disposed in one portion of the plasma formation chamber and for extracting the ions from the plasma formation chamber so as to form an ion beam in the form of shower; a specimen chamber in which the surface of a specimen subjected to etching or deposition or a target subject to sputtering is irradiated with the ion beam in the form of shower; and a shield grid disposed in the vicinity of the ion extraction grid in the plasma formation chamber and spaced apart from the thickness of the plasma sheath produced over the ion extraction grid. The shield grid permits the passage of the plasma therethrough and at the same time prevents the electric field produced by the ion extraction grid substantially from extending to the remaining region or portion of the plasma formation chamber.

The above-described plasma can be produced in response to the discharge caused by means of a thermionic cathode or electron cyclotron resonance caused by microwave.

It is preferable that the ion extraction grid is made of silicon or carbon.

It is also preferable that an insulating member like an insulating film is formed over the surface of the ion extraction grid which is in contact with plasma.

BRIEF DESCRIPTION OF THE DRAWINGS

FIG. 4A is a schematic diagram showing another fundamental arrangement of an ion shower apparatus in accordance with the present invention which is suitable for ion beam sputtering;

FIG. 7 illustrates characteristic curves showing the effect of a shield electrode on a spark discharge voltage;

FIG. 8 illustrates a relationship between an applied voltage (V) and an ion current density (mA/cm$^2$) of an ion shower apparatus in accordance with the present invention;

FIG. 17 illustrates a relationship between the applied voltage and the ion current density.

DETAILED DESCRIPTION OF PREFERRED EMBODIMENTS

Figure 1:
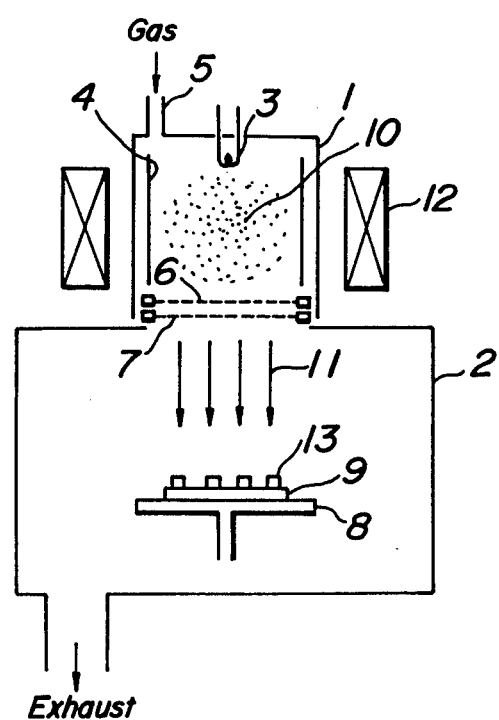
FIG. 1 is a schematic diagram showing a first example of a prior art ion shower apparatus for etching with a two-grid system.
Figure 2:
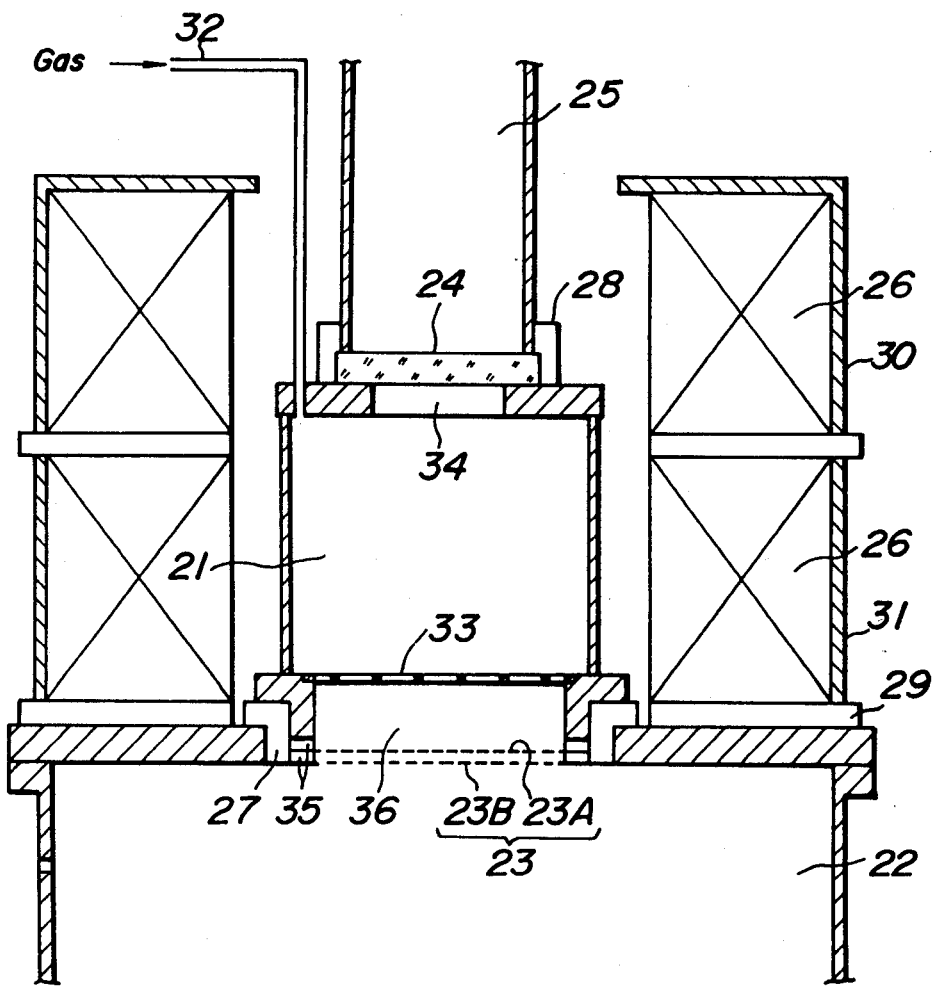
FIG. 2 is a sectional view schematically showing a second example of a prior art ion shower apparatus with a two-grid system.

Same reference numerals are used to designate similar parts throughout the figures.

Figure 4:
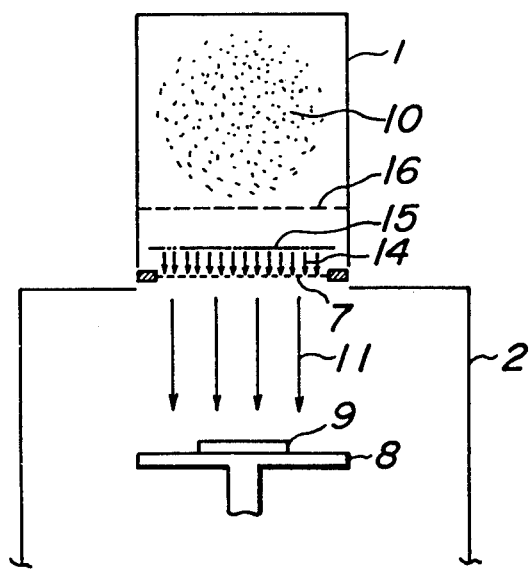
FIG. 4 is a schematic diagram showing a fundamental arrangement of an ion shower apparatus in accordance with the present invention which is suitable for ion etching, reactive ion etching and ion beam deposition.

FIG. 4 shows a fundamental arrangement of an ion shower apparatus in accordance with the present invention. Reference numeral 1 denotes a plasma formation chamber; 2, a specimen chamber; 7, a single ion extraction electrode; 8, a substrate table; 9, an object to be subjected to etching, deposition or sputtering, for example, a substrate or specimen; 10, plasma; 11, an ion beam in the form of a shower; 14, a plasma sheath; and 15, a sheath surface. According to the present invention, a shield electrode 16 is disposed in the vicinity of the extraction electrode 7 and is spaced apart from the thickness of the plasma sheath 14 formed above the ion extraction electrode 7, so that the plasma 10 passes through the shield electrode 16 and at the same time the electric field produced by the ion extraction electrode 7 does not affect the remaining region of the plasma formation chamber 1. The potential applied to the shield electrode 16 is equal to the potential at the plasma formation chamber 1.

Further, the above-described arrangement is for an ion shower apparatus for ion etching, reactive ion etching or ion base sputtering. In case of an ion shower apparatus for ion beam sputtering, the specimen chamber 2 is modified as shown in FIG. 4A. A target 18 as a specimen to be sputtered is to be so disposed that the ion shower 11 is incident to the target 18. For instance, the target 18 may be disposed at a given angle relative to the ion shower 11 and the substrate 9 as a specimen to which the sputtered target atoms 19 are deposited is disposed on the table 8 in the specimen chamber in such a way that the sputtered target atoms 19 are disposed on the substrate 9.

The mode of operation of the ion shower apparatus is as follows. Ions are extracted from the plasma 10 produced in the plasma formation chamber 1 by means of the single ion extraction electrode 7 and the ion beam 11 in the form of a shower impinges against the substrate or specimen 9 on the table 8 in the etching chamber 2. When the ions are extracted from the plasma 10, the ion extraction electrode 7 is grounded, while a positive potential is applied to the plasma formation chamber 1.

Alternatively, the plasma formation chamber 1 is grounded, while a negative potential is applied to the ion extraction electrode 7. Then, the plasma sheath 14 and the sheath surface or interface 15 are formed. Thus, the ion beam in the form of a shower 11 can be extracted by the potential difference between the sheath surface 15 and the ion extraction electrode 7 in a manner substantially similar to that of an ion shower apparatus with two electrodes.

In this case, even if the plasma 10 is not produced, it is necessary that the electric field produced by the application of a voltage between the plasma formation chamber 1 and the ion extraction electrode 7 is limited only to the region between the shield electrode 16 and the ion extraction electrode 7 and is not extended to the remaining region in the plasma formation chamber 1.

According to the Paschen's law, a voltage (spark voltage) which causes spark-over in a uniform electric field gap varies depending upon a type of gas, a gas pressure and a gap. For instance, in the case of argon gas at the pressure of $1\times 10^{-3}$ Torr and when the gap is 100 cm, the spark-over voltage is about 200 V. It is well known in the art that a gap and a spark voltage at which the spark discharge occurs are remarkably reduced when electrons and ions exist or in the case of ultraviolet ray irradiation or heating by the light emission in plasma, so that the spark-over tends to occur very easily. A distance between the opposite electrodes of various shapes can be defined by the length of an electric line of force perpendicular to an equipotential surface.

In view of the above consideration, it is very important to determine a grid shape and dimensions of the shield electrode 16 and a distance between the shield electrode 16 and the ion extraction electrode 7, so that the plasma 10 can freely move toward the ion extraction electrode 7 and that the length of the electric line of force between the ion extraction electrode 7 and the shield electrode 16 is sufficiently shorter than a gap determined by Paschen's law. It is of course essential that the distance between the shield electrode 16 and the ion extraction electrode 7 is sufficiently greatly than the thickness of the plasma sheath 14 so that the ion extraction characteristics of the ion extraction electrode 7 are not adversely affected.

Figure 5:
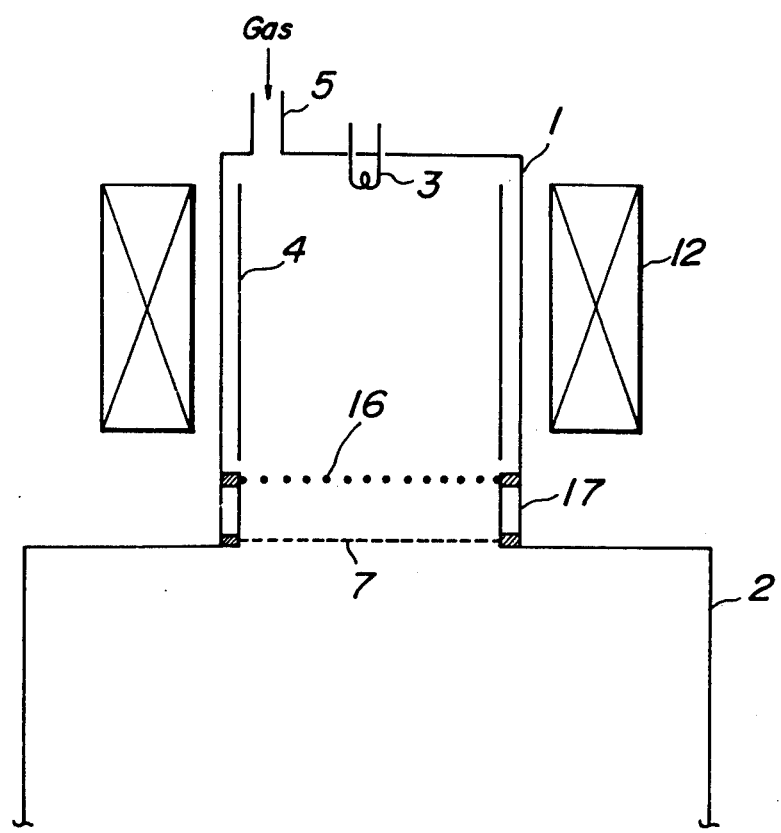
FIG. 5 is a schematic diagram showing a first embodiment of an ion shower apparatus in accordance with the present invention in which a thermionic cathode is used.

FIG. 5 shows a first embodiment of an ion shower apparatus in accordance with the present invention. Here, the inside structure of the specimen chamber 2 is omitted in order to focus on the structure of the plasma formation chamber 1 and can be constructed as shown in FIG. 4 or 4A. In the first embodiment, plasma is produced by a thermionic cathode. Reference numeral 1 denotes a plasma formation chamber; 2, a specimen chamber; 3, a thermionic cathode; 4, an anode; 5, a gas inlet; 7, an ion extraction electrode; 12, a solenoid magnet; and 16, a shield electrode. Reference numeral 17 denotes an insulation spacer disposed between the electrodes 7 and 16.

Further, it is to be noted that there is arranged a specimen table for supporting a specimen to be subjected to etching or deposition or a target to be sputtered and a specimen table for supporting a specimen to which the sputtered atoms are deposited in the specimen chamber 2.

In the mode of operation of the ion source, argon Ar, for instance, is introduced through the gas inlet 5 to the plasma formation chamber 1 at the pressure of $1.0\times 10^{-4}$ Torr. The DC current of 21 A is supplied to the thermionic cathode 3, while a DC voltage of 19 V is applied to the anode 4, so that plasma is produced. Ionization efficiency is increased by supplying the DC current of 1.0 A to the solenoid magnet 12. The ion extraction electrode 7 is grounded and a DC voltage is applied to the plasma formation chamber 1 via the insulation spacer 17. The ion extraction electrode 7 is a molybdenum disk having a diameter of 4 inches and a thickness of 0.5 mm. There are formed apertures which are 3 mm in diameter and spaced apart from each other by 4 mm, thereby forming a grid. The shield electrode 16 consists of a plurality of molybdenum wires 1 mm in diameter which are arranged in the form of a grid with 5 mm×5 mm square apertures. The shield electrode 16 is spaced apart from the ion extraction electrode 7 by 20 mm. The potential applied to the shield electrode 16 is equal to that applied to the plasma formation chamber 1.

According to experiments, even when a voltage of 1,000 V is applied to the plasma formation chamber 1, the operation of the ion source is stable, so that the shower-like ion beam can be obtained in a stable manner. When a voltage of 500 V is applied, the thickness of the plasma sheath is about 2 mm. Therefore, even when the ion extraction electrode 7 is formed with apertures 3 mm in diameter, the sheath surface and the ion extraction electrode 7 are parallel with each other. As a result, the shower-like ion beamm with a high degree of directivity can be obtained.

Figure 3:
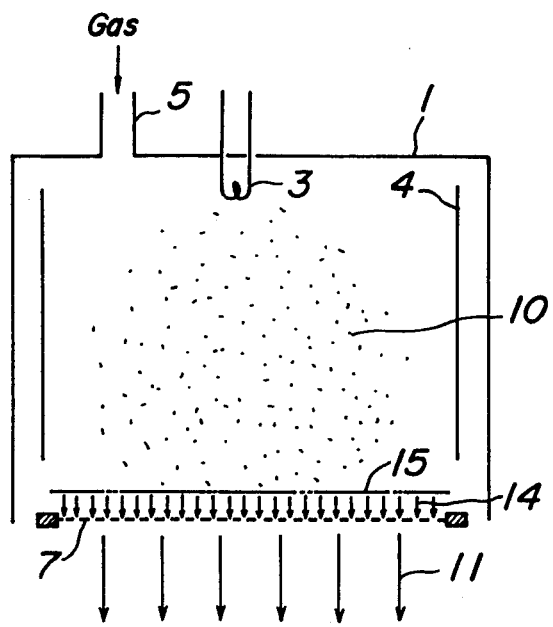
FIG. 3 is a schematic diagram showing a third example of a prior art ion shower apparatus with a single ion extraction grid.
Figure 6:
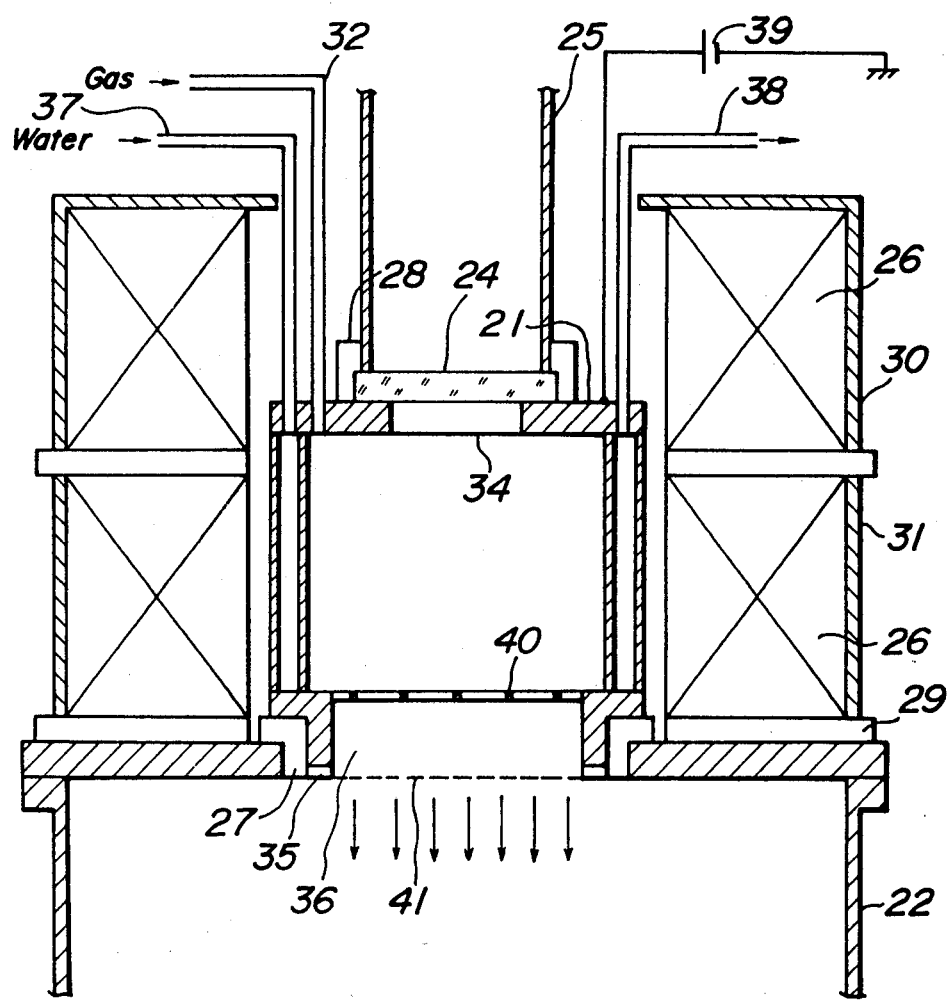
FIG. 6 is a schematic view of a second embodiment of the present invention in which electron cyclotron resonance excited by microwave is utilized.

FIG. 6 shows a second embodiment of the present invention. Here, the inside structure of the specimen chamber 22 is omitted in order to focus on the structure of the plasma formation chamber 21 and can be constructed as shown in FIG. 4 or 4A. In the second embodiment, electron cyclotron resonance caused by microwave is used to produce plasma. Reference numeral 21 denotes a plasma formation chamber; 22, a specimen chamber; 24, a microwave inctroducing window made of fused quartz; 25, a rectangular waveguide; 26, a maentic coil; 27, 28 and 29, insulating members; 30 and 31, magnetic shield members with a high permeability; 32, a gas inlet; 14, a microwave coupling window; 35, an insulating spacer; and 36, a plasma transport chamber. Reference numeral 37 denotes a cooling water inlet; 38, a cooling water outlet; 39, an ion extraction power supply; and 40, a microwave reflection plate which also serves as a shielding electrode. The plasma formation chamber 21 defined by the shield electrode 40 is used as a cylindrical cavity resonator so that the electric field is increased in order to enhance the ionization. Reference numeral 41 denotes a single ion extraction electrode which is substantially similar in construction to the ion extraction electrode 7 as shown in FIG. 3.

Further, it is to be noted that there is arranged a specimen table for supporting a specimen to be subjected to etching or deposition or a target to be sputtered and a specimen table for supporting a specimen to which the sputtered atoms are deposited in the specimen chamber 22.

In order to operate the ion source, for instance, $C_2F_6$ is introduced through the gas inlet 32 to the plasma formation chamber 21 at the pressure of $1\times 10^{-3}$ Torr. The microwave at the frequency of 2.45 GHz with a power of 200 W is introduced through the rectangular waveguide 25, the microwave introducing window 23 and the microwave coupling window 34 into the plasma formation chamber 21. Simultaneously, the magnetic field of 875 G is applied by the solenoid magnet 26, so that the electron cyclotron resonance is produced at least at one portion in the plasma formation chamber 21. In order to prevent the plasma formation chamber 21 from being heated due to the production of the plasma, cooling water flows from the inlet 37 to the outlet 38. The magnetic shield members 30 and 31 with a high permeability surround the solenoid magnet 26 and cover the top thereof so that a divergent magnetic field which is decreased in strength toward the ion extraction electrode 41 is procured within the plasma formation chamber 21. As a consequence, the ions in the plasma formation chamber 21 may easily move toward the ion extraction electrode 41.

In order that the microwave power may be efficiently absorbed by the plasma in the plasma formation chamber 21, the dimensions of the plasma formation chamber 21 is so determined as to satisfy the condition of microwave cavity resonator. For instance, the inner height and the inner diameter of the plasma formation chamber 21 are 200 mm and 170 mm, respectively, for the condition of microwave cavity resonator of $(TE_{113})$. The microwave is reflected back by the shield electrode 40 which also functions as the microwave reflector; that is, the height of the microwave cavity resonator is defined by the electrode 40. Furthermore, the insulating spacer 35 is interposed between the lower end of the plasma formation chamber 21 and the ion extraction electrode 41 in a manner that the electric field produced by the ion extraction electrode 41 is prevented from being extended to the interior of the plasma formation chamber 21. The shield electrode 40 which also serves as the microwave reflector consists of a stainless plate formed with a matrix array of 18 mm × 18 mm square apertures spaced apart from each other by 20 mm. The ion extraction electrode 41 consists of a stainless disk 180 mm in diameter and 0.5 mm in thickness. The stainless steel disk 41 is formed with apertures 2 mm in diameter spaced apart from each other by 2.5 mm. The shield electrode 40 serving as the microwave reflecting plate and the ion extraction electrode 41 are spaced apart from each other by 30 mm. The ion extraction electrode 41 is grounded and a DC voltage is applied to the plasma formation chamber 21.

FIG. 7 illustrates an effect of the shield electrode on the spark-over voltage. The characteristic curve A is obtained when the distance between the shield electrode 40 and the ion extraction electrode 41 was 30 mm in the arrangement shown in FIG. 6. The curve B is obtained when the distance was 100 mm; that is, when the shield electrode 40 is eliminated in FIG. 6. In the latter case, in a normal operation pressure range from 0.08 Pa to 0.2 Pa and in a voltage range from 500 V to 300 V, the spark-over occurs and the stable operation is not ensured. In the case of the characteristic curve A, in the normal operation pressure range from 0.08 Pa to 0.2 Pa, the spark discharge occurs at a voltage higher than 1,000 V and the stable operation may be ensured over a wide range of gas pressure.

FIG. 8 illustrates current characteristic curve obtained from experimental results when the ion shower apparatus of the present invention as shown in FIG. 6 is used. The shield plate 40 which also serves as the microwave reflecting plate was very effective in producing stable plasma and in preventing the spark discharge. Even when the voltage of 1,000 V was applied, the stable showerlike ion beam was produced. The ion density increases in linear proportion with the increase of the voltage applied, as illustrated in FIG. 8. At 400 V and 1,000 V, the ion current densities of 1 mA/cm$^3$ and 3 mA/cm$^3$ were obtained in a stable manner, respectively. The ion extraction electrode 41 is considerably rigid so that even when the ions are extracted at such a high density as described above, the ion extraction electrode 41 was prevented from being deformed as a result of heating due to ion bombardment.

In this way, an ion shower apparatus according to the present invention can obtain an ion current stably in a wide voltage range. Accordingly, the present invention is widely applicable to ion beam deposition in which a relatively low voltage is used as well as ion beam sputtering, ion etching or reactive ion etching in which a relatively high voltage is used.

Figure 9:
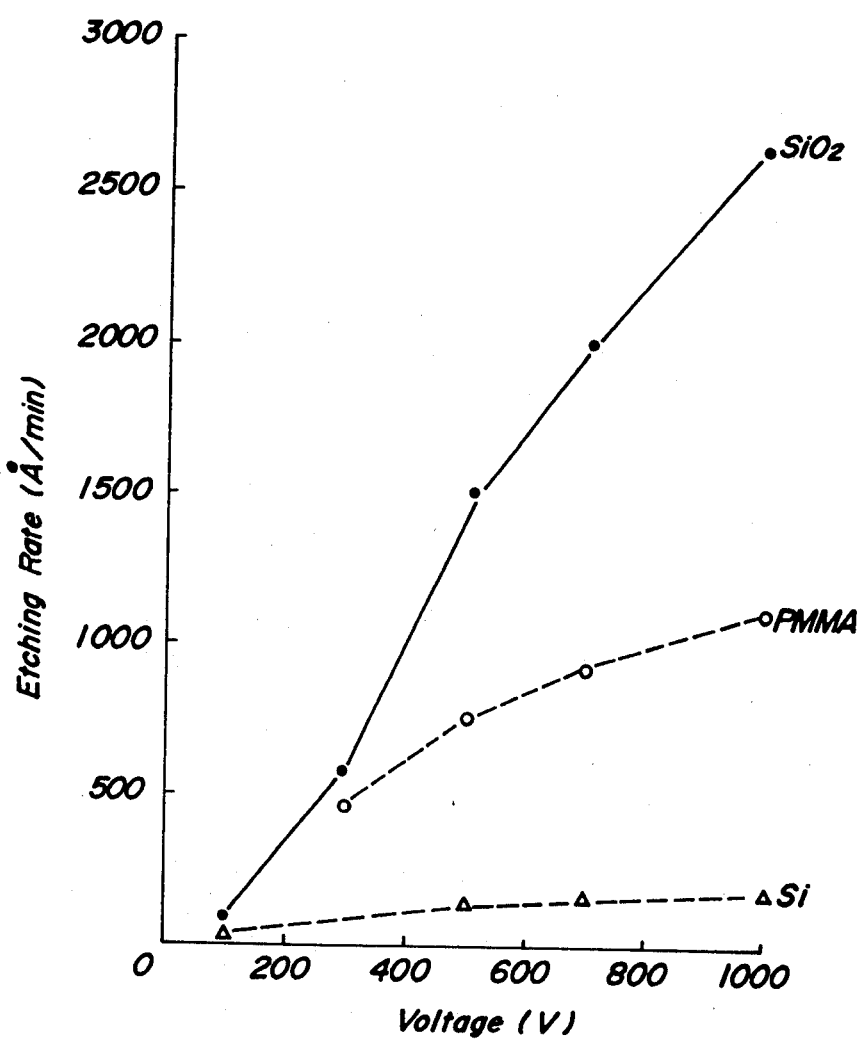
FIG. 9 illustrates a relationship between an applied voltage (V) and an etching rate (Å/min) of an ion shower apparatus in accordance with the present invention.

FIG. 9 illustrates the results of the experiments of the selective etching of SiO$_2$, in case that an etching is processed by the ion shower apparatus in accordance with the present invention. That is, in FIG. 9 there are shown etching rates of various materials etched by the ion shower apparatus as shown in FIG. 6. The etching rate of Si, which is desired to be restricted, has a very small dependence on the applied voltage. That is, the etching rate was about 150 Å/min at 1,000 V. On the other hand, in the case of the etching of SiO$_2$, the etching rate is greatly dependent upon the voltage applied. Very efficient etching rates such as 1,000 Å/min at 400 V and 2700 Å/min at 1,000 V were obtained. The ratio of the etching rate of SiO$_2$ to the etching rate of Si, which reflects an etching selectivity, is about three at 100 V, but the ratio increases to 10 at 400 V and to 18 at 1,000 V. The etching rate of PMMA (polymethyl methacrylate) resist, which is used as an etching mask of a SiO$_2$ film, is an intermediate between the etching rate of SiO$_2$ and the etching rate of Si. The ratio of the etching rate of SiO$_2$ to the etching rate of PMMA was about 2 to 400 V, which is satisfactory in practice.

Figure 10:
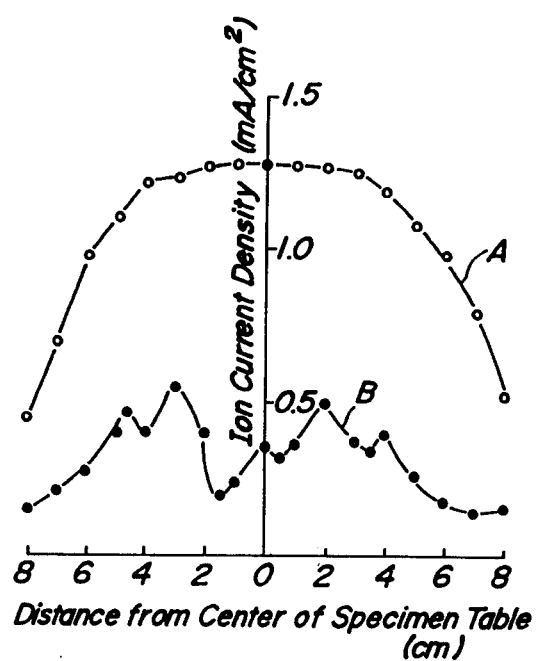
FIG. 10 illustrates characteristic curves which in turn show the uniformity of an ion shower produced in an ion shower apparatus in accordance with the present invention.

FIG. 10 illustrates an ion shower distributions on the substrate or specimen table disposed substantially perpendicular to the ion shower. The experimental results shown were obtained under the conditions that a C$_2$F$_6$ gas was used, a pressure in the plasma formation chamber was 0.28 Pa and a microwave power was 200 W. The characteristic curve A shows the experimental result when the ion shower apparatus in accordance with the present invention was used, while the characteristic curve B shows the experimental result when a prior art ion shower apparatus having two electrodes was used. According to the characteristic curve A, the variation in ion current density within the region of a diameter of 10 cm from the center of the table is ±5%. Thus, a uniform ion shower can be obtained with a large diameter. In contrast, the characteristic curve B shows that the ion shower is not uniform, since a distance between the two electrodes varies due to the thermal deformations. While in the case of the curve B, instead of molybdenum which is less thermally deformed, a stainless steel is used which is easily thermally deformed. As a result, the ion current density varied over a wide range. However, according to the present invention, only one ion extraction electrode is used, so that even if a stainless steel which easily tends to be thermally deformed is used, a uniform ion shower can be obtained without an influence of such deformation.

According to the present invention, only one ion extraction electrode is used and it is preferable that the ion extraction electrode is made of silicon or carbon so that the contamination of a specimen to be etched by metals forming the ion extraction electrode may be avoided. The reason is that even if the ion extraction electrode 7 or 41 is sputtered by ions impinged thereon and the sputtered particles are deposited to the specimen being etched, this deposition does not lead to the contamination of the surface of the specimen in case of a semiconductor device consisting of materials in the same category and the specimen is not contaminated by foreign material. Thus, the silicon and carbon are very effective in preventing specimens to be subjected to etching or deposition from being contaminated with metals. The silicon and carbon have high resistance to heat, but are fragile. Accordingly, they have not been used in a prior art ion shower apparatus where it is required to use a thin film and to form a plurality of fine apertures. In contrast, according to the present invention, they can be advantageously used for the first time in an ion shower apparatus.

As described above, according to the present invention, in an ion shower apparatus of the type in which ions produced in the plasma formation chamber are accelerated by the single ion extraction electrode and extracted into the etching chamber, the shield electrode is disposed in the plasma formation chamber and spaced apart from the ion extraction electrode by a distance which is sufficiently shorter than a distance defined by Paschen's law and which is sufficiently greater than the thickness of the plasma sheath produced over the single ion extraction electrode. As a result, a high voltage may be applied to the single ion extraction electrode and a high current density can be obtained stably. Therefore, when the ion shower apparatus in accordance with the present invention is applied to the manufacture of semiconductor devices, an ion energy can freely be selected to the extent that a physical damage to a substrate is allowable. Furthermore, the ion shower apparatus in accordance with the present invention is not only applicable to the manufacture of semiconductor devices but also equally applicable with a practical processing speed to other fields such as polishing or modification of surfaces which has been only accomplished by a chemical processing liquid or the like because of a low processing rate of an ion shower apparatus of prior art.

Figure 11:
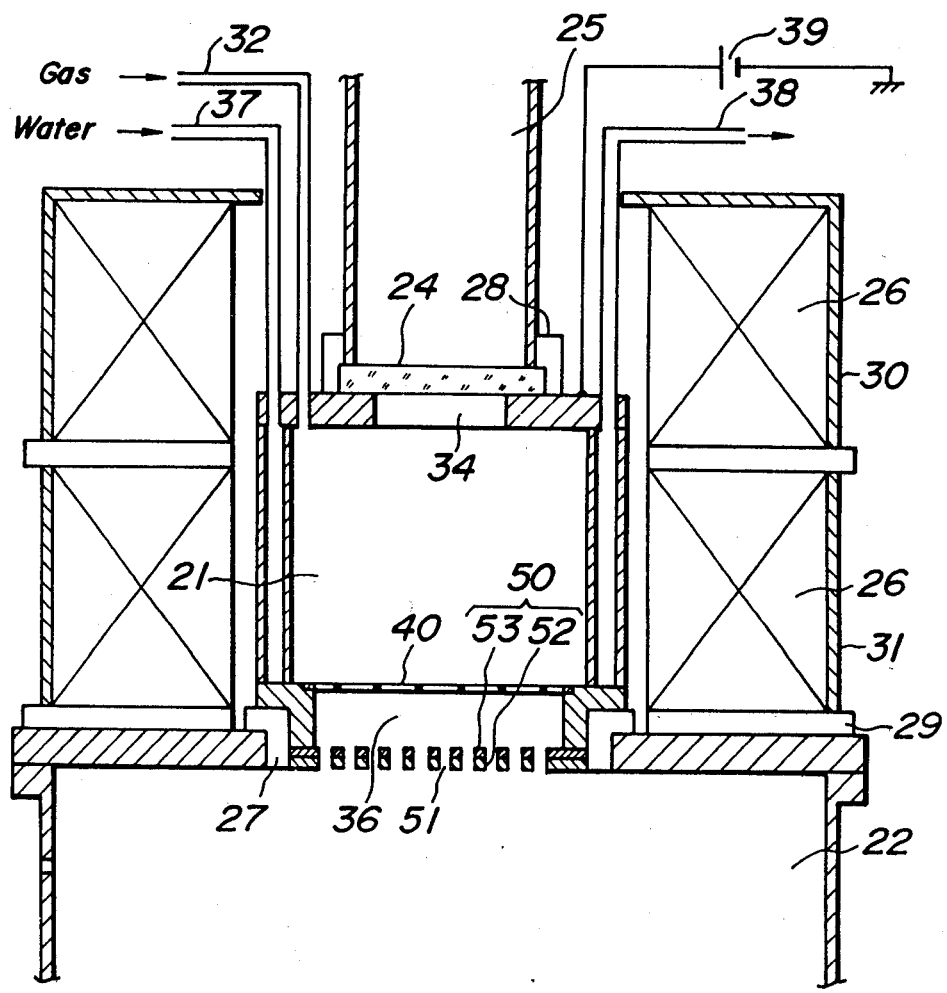
FIG. 11 is a sectional view schematically showing a third embodiment of the present invention.

FIG. 11 shows a third embodiment of the present invention in which an insulating member is provided on the surface of an ion extraction electrode. The surface is on the side of the plasma formation chamber. Reference numeral 50 denotes a single ion extraction electrode on the upper surface (that is, the surface in contact with plasma) of which an insulating member is provided. Here, the inside structure of the specimen chamber 22 is omitted in order to focus on the structure of the plasma formation chamber 21 and can be constructed as shown in FIG. 4 or 4A.

Further, it is to be noted that there is arranged a specimen table for supporting a specimen to be subjected to etching or deposition or a target to be sputtered and a specimen table for supporting a specimen to which the sputtered atoms are deposited in the specimen chamber 22.

Further, cooling water is supplied from the water inlet 37 and then is discharged from the water outlet 38. The ion extraction power source 39 is connected to the plasma formation chamber 21.

In operation, an etching gas such as $C_2F_6$ or $C_4F_8$ is introduced to the plasma formation chamber 21 and the pressure within the plasma formation chamber 21 is maintained at $5 \times 10^{-5}$ through $5 \times 10^{-3}$ Torr. Microwave of 2.45 GHz ($TE_{10}$ mode) is introduced into the plasma formation chamber 21 from the rectangular waveguide 25, while the magnetic field of 875 G is produced by the magnetic coil 26 so that the electron cyclotron resonance may be produced at least one portion in the plasma formation chamber 21. The microwave reflector 40 which also serves as the shield grid permits the free movement of the plasma to the ion extraction electrode or grid 50, but reflects the microwave so that the microwave cannot pass through the ion extraction grid 50. In the third embodiment, the shield grid 40 is formed by a metal plate having a plurality of 18 mm×18 mm square apertures spaced apart from each other by 20 mm and is spaced as art from the ion extraction grid 50 by 30 mm. In order to facilitate fthe absorption of the microwave by plasma, the inner diameter of the plasma formation chamber 21 is determined to be 170 mm and the inner height between the top of the plasma formation chamber 21 and the shield electrode or grid 40 is determined to be 200 mm, so that the plasma formation chamber 21 is in the form of a microwave cavity resonator. In order to extract ions from the plasma, a positive voltage is applied to the plasma formation chamber 21 by the power source 39, while the ion extraction electrode or grid 50 is grounded.

The ion extraction electrode or grid 50 is formed by a conductor member 52 and an insulating member 53. The conductor member 52, for example, a conductor plate is formed by a stainless steel disk of 150 mm in diameter and 0.5 mm in thickness with apertures 51, each of which has 2 mm in diameter and is spaced apart from each other by 2.5 mm. The insulating member 53 is comprised of a polyimide film of 0.3 mm in thickness. The polyimide film is formed by spraying polyimide over the upper surface of the conducting plate 52 on the side of contacting the plasma and then drying and heat-treating the sprayed polyimide. The insulating film 53 serves to electrically isolate the conducting plate 52 from the plasma and may be regarded as in a floating condition. Therefore, a negative potential is produced in the insulating film in a self-regulation manner in accordance with the electron energy of plasma. Accordingly, even though only one ion extraction grid 50 is provided, it functions like the prior two-grid system. Therefore, the problem that high-energy electrons in the plasma flows into the ion extraction grid or electrode 50 so that the grid or electrode 50 is locally heated may be avoided. Furthermore, even if a voltage as high as 1,000 V is applied between the plasma formation chamber 21 and the ion extraction electrode 50, a shower-like ion beam can be obtained stably. Further, the aperture 51 means an opening and may be in the form of a various hole, like a round hole, an elliptical hole, a square hole, a rectangular hole or the like. The dimensions of the aperture 51 refer to a size of the opening, for instance, a diameter of the round hole, a minor axis of the elliptical hole or the shortest side of the rectangular hole.

Figure 12B:
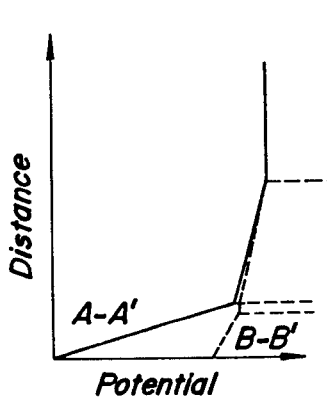
FIG. 12B illustrates a potential distribution corresponding to the ion extraction grid as shown in FIG. 12A.
Figure 12A:
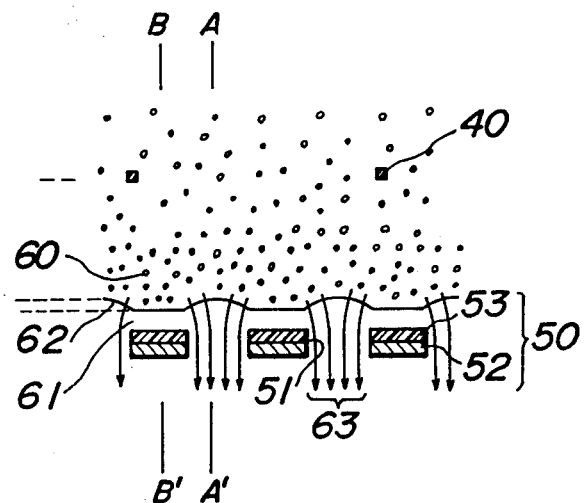
FIGS. 12A, 13 and 14 are fragmentary sectional views, respectively, on enlarged scale, of three examples of an ion extraction grid of the ion shower apparatus shown in FIG. 11.

Next referring to FIGS. 12A and 12B, the detail of the ion extraction grid of the ion shower apparatus shown in FIG. 11 will be described. In FIG. 12A, reference numeral 60 denotes plasma; 61, a plasma sheath; 62, a plasma surface; and 63, an ion beam in the form of a shower.

Ions in the plasma 60 reach the sheath interface 62 and flow into the plasma sheath 61 toward directions perpendicular to the sheath interface 62. As a result, the ions are imparted with an energy and a directivity depending upon the distribution and strength of the electhickness of 0.3 mm. The disk has apertures 51 which are 3 mm in diameter spaced apart from each other by 4 mm. The shield electrode 16 consists of a plurality of molybdenum wires of 1 mm in diameter which are so arranged as to define square apertures of 5 mm×5 mm. The shield electrode 16 is spaced apart from the ion extraction grid 50 by 20 mm. The potential applied to the shield grid 16 is equal to that applied to the plasma formation chamber 1. In experiments, an argon gas was introduced through the inlet 5 into the plasma formation chamber 1. The pressure in the plasma formation chamber 1 was maintained at $1.0 \times 10^{-4}$ Torr. A DC current of 21 A was supplied to the thermionic cathode 3 and a DC voltage of 19 V was applied to the anode 4, so that plasma was produced. A DC current of 1.0 A was supplied to the magnetic coil 12 in order to enhance the ionization efficiency. The shower-like ion beam was obtained by grounding the ion retraction grid 50, while applying a positive DC voltage to the plasma formation chamber 1. The experiments show that a shower-like ion beam was produced stably, even if the voltage of 1,000 V is applied.

Figure 16:
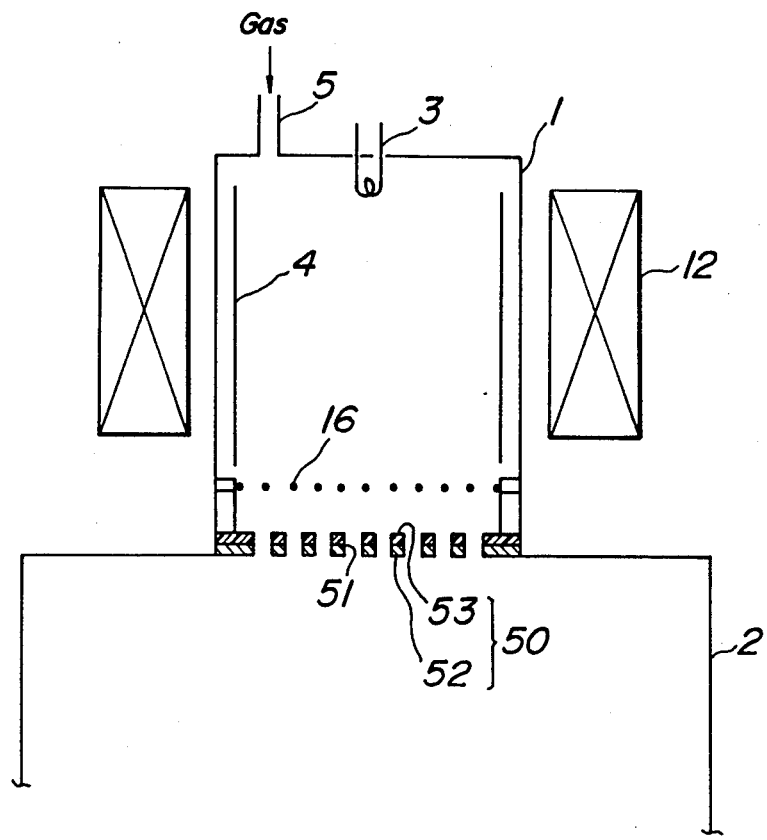
FIG. 16 is a schematic diagram showing a fourth embodiment of the present invention.

While the embodiments have been explained in which the ion extraction grid 50 consists of the conductor plate 52 made of stainless steel or molybdenum and the insulating member 53 of polyimide film, it is to be understood that the present invention is not limited to these materials and that other materials may be equally used. For instance, the conductor plate 52 may be made of carbon or silicon and the insulating member 53 may be alumina or silicon dioxide such as working ceramic (for example, MACOR, a trademark of Corning Glass Works). All these materials have a high melting point and are stable, even if they are exposed to plasma, so that their temperature becomes high. In addition, since semiconductor devices are made of these materials, even if these materials are sputtered by ions, the same materials as the semiconductor devices are vaporized and deposited on the surface of the semiconductor devices. Thus, the surfaces of the semiconductor devices are not contaminated. In the embodiments as shown in FIGS. 11 and 16, if the ion extraction grid 50 consisting of the conductor plate 52 made of carbon and the insulating member 53 made of silicon dioxide is used, then semiconductor materials could be subjected to etching or deposition without the contamination the specimen surface.

While in the above-described embodiments, a polyimide film has been deposited or otherwise formed on the whole surface of a stainless steel or molybdenum plate on the side in contact with plasma, it is to be understood that when an ion extraction grid is combined with a shield grid, an insulating film may be partially formed. This is preferable when it is desired that a large current is partially derived or that an effective ion source dimensions are increased by improving the current density distribution around the inner peripheral portion of the ion source.

Further, the conductor plate of the ion extraction grid may consist of other screens such as wire cloth with suitable openings, for instance, a molybdenum screen with square openings, instead of the apertured conductor plate as described above.

As explained in the above, according to the present invention, a single ion extraction grid is used in an ion shower apparatus. The ion extraction grid consists of a conductor member and an insulating member closely arranged on the surface of the conductor member on the side in contact with the plasma. Therefore, damage to the ion extraction grid due to electrons and ions may be minimized and the ion current extracted can be increased. In addition, a shower-like ion beam can be produced stably by the combination of the ion extraction grid with the shield grid.

Thus, the present invention provides an ion shower apparatus which is adapted for use in the etching or ion beam sputtering process in the manufacture of semiconductor devices in which a high ion current must be supplied in a stable manner with a low energy so that the surface being etched is free from any defect layer in which a crystal structure is disordered.

Various electrodes are investigated in order that an ion shower apparatus is adapted for use in an etching process in the manufacture of semiconductor devices. The results are shown in FIG. 17. In the experiments, $C_2F_6$ was used as an etching gas and was introduced to a plasma formation chamber, the pressure in which was maintained at 0.28 Pa. The microwave power was 200 W. In the case of ion etching, an electrode material is sputtered by ion bombardment and vaporized atoms and molecules are deposited to the etched surface of a semiconductor material. As a result of such a drawback, an ion shower apparatus has not been used in the manufacture of semiconductor devices.

In FIG. 17, a characteristic curve A shows a relationship between an applied voltage and an ion current density when the single ion extraction grid is made of carbon. It is seen that as compared with a characteristic curve C of a two-electrode type apparatus of prior art, an ion current density higher than 1 mA/cm$^2$ was obtained in case of the curve A, even at a low voltage. Even if a carbon electrode is sputtered, there arises no problem of contamination of the etched surface, because freon series gas ($C_nF_m$) is normally used. A characteristic curve B shows a relationship between an applied voltage and an ion current density when the insulating film is deposited over the surface of the stainless steel electrode. It is seen in the curve B that the ion current density can be increased as compared with the case of the characteristic curve A. In addition, there arises no problem of the contamination of the etched surface.

It is apparent that the present invention may equally be applied to an ion shower apparatus in which a high-frequency discharge or the like is used to produce plasma for ionization. It is also apparent from the foregoing that the present invention is applicable not only to an ion etching apparatus but also to an ion beam sputtering apparatus for forming a film by a deposition process utilizing ion beam sputtering technique. In this case, it is necessary to provide a holder for supporting a target at a given angle relative to an ion shower extracted from the plasma formation chamber and a specimen table for placing a specimen at such a position that the sputtered atoms are deposited to the specimen.

Furthermore, the present invention is also applicable to an ion beam deposition process in which a raw material gas such as SiH$_4$ is introduced to the plasma formation chamber in which ions to be deposited to form a film are produced, and then the ions are introduced to the specimen chamber so as to form the film directly on the specimen.

While in the above embodiments the ion extraction electrode or grid has been illustrated in the form of a planar plane, the ion extraction electrode may have a curved surface. If the ion extraction electrode is formed tric field in the plasma sheath 61. When the thickness of the plasma sheath 61 is smaller than the dimensions of the aperture 51 of the ion extraction grid 60; that is, when the applied voltage is low, the sheath interface 62 becomes convex upward with respect to the apertures 51, i.e., concave downward with respect to the direction of the travelling of the plasma.

If a voltage applied is increased so that the thickness of the plasma sheath 61 is increased, or the dimensions of the apertures 51 are decreased no electric field is extended to the insulating film 53 so that a potential at the insulating film 53 is substantially the same as the plasma potential. Therefore, the thickness of the plasma sheath 61 is self-regulated corresponding to the electron energy upon the insulating film 53, whereas the thickness of the plasma sheath above the apertures 51 is determined by a voltage applied between the plasma formation chamber 21 (plasma 60) and the conductor plate 52. Therefore, as shown in FIG. 12A, the sheath interface 62 becomes convex upward with respect to plasma 60. Under these conditions, the ion convergence is facilitated so that the ion current extraction efficiency and the directivity of the extracted ion current can be improved. As a result, the number of ions impinged against the extraction grid 50 is decreased and even if the ions impinge against the extraction grid 50, only a low voltage which is self-regulated corresponding to the flow of electrons appears at the plasma sheath 61 above the insulating film 53. Since an energy of incident ions is less as described above, the damage of the ion extraction grid 50 due to the ion bombardment can be reduced to a minimum.

According to the present invention, as described above, the insulating film 53 is formed on the conductor plate 52 of the ion extraction grid 50, so that the ions with a high energy can be prevented from impinging against the conductor plate 52. Furthermore, the effect of ion convergence can be expected by the plasma sheath 61. These effects vary depending upon the thickness of the plasma sheath 61 which is produced in a self-regulation manner corresponding to the energies of electrons impinged against the insulating plate 53, the thickness of the plasma sheath 61 produced in response to the voltage applied to the conductor plate 52, the thickness of the conductor plate 52, dimensions of the apertures 51 and so on. When the conditions vary as described above, the desired effect of the present invention can be attained by modifying the shape of the insulating film 53.

Figure 13:
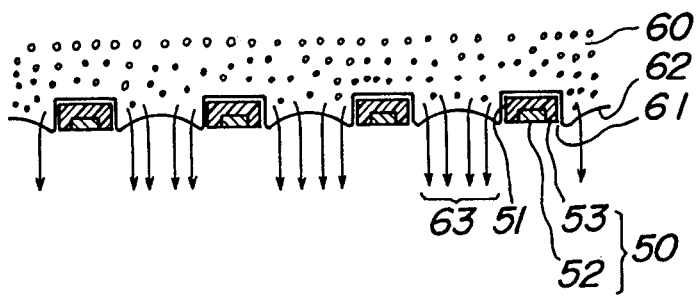

For instance, in an example shown in FIG. 13, the thickness of the plasma sheath 61 produced in a self-regulation manner on the insulating film 53 and the thickness of the plasma sheath 61 produced in response to the application of a voltage to the conductor plate 52 is small as compared with the dimensions of the apertures 51 of the ion extraction grid 50. In this case, it is preferable that the insulating film 53 is so formed that it covers the side and top surfaces of the conductor plate 52.

Figure 14:
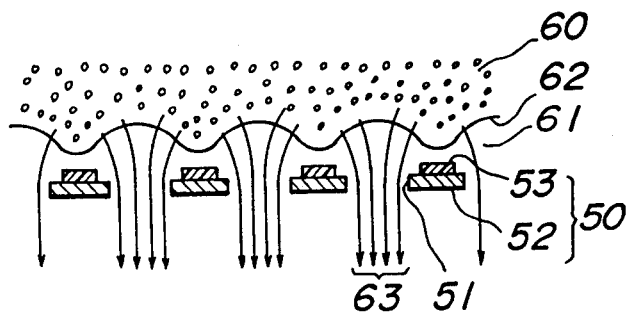

FIG. 14 shows an example which is opposite to the example shown in FIG. 13. That is, the thickness of the plasma sheath 61 is greater as compared with the dimensions of the apertures 51 of the ion extraction grid 50. In this case, it is preferable that the insulating film 53 is formed on the upper surface of the conductor plate 52 and the width of the insulating film 53 is shorter than that of the conductor plate 52 to the extent that the ions with high energies do not impinge against the conductor plate 52.

Figure 15:
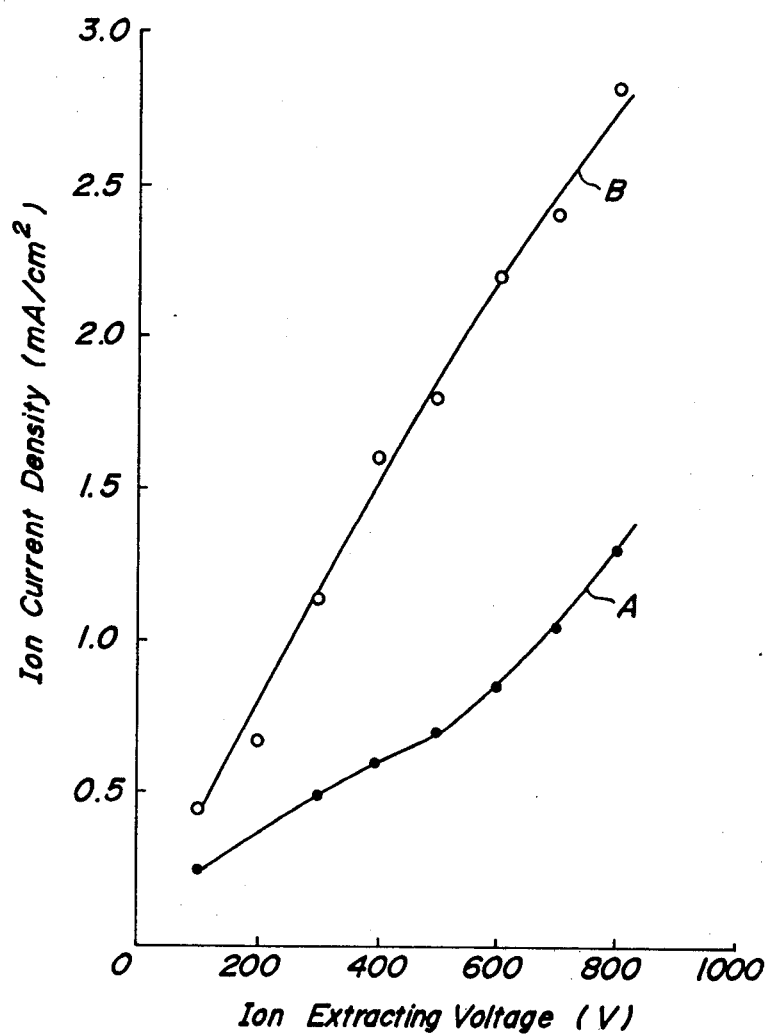
FIG. 15 illustrates a relationship between an ion extraction voltage and an ion current density of the ion shower apparatus shown in FIG. 11.

FIG. 15 illustrates measured results of ion current characteristics, i.e., a relationship between an ion extraction voltage and an ion current density. Experimental data were obtained under the conditions that the flow rate of a $C_2F_6$ gas was 10 cc/min and the gas pressure was $2.0 \times 10^{-3}$ Torr. The characteristic curve A shows the prior art case in which two electrodes or grids were spaced apart from each other by 1.5 mm, and one of the two electrodes or grids on the side in contact with the plasma was floated. The microwave power was 300 W. The characteristic curve B shows an embodiment according to the present invention, in which a polyimide insulating film 53 of 0.3 mm in thickness was formed on the surface of the conductor plate 52 which was in contact with plasma. The microwave power was 250 W.

It is seen from FIG. 15 that according to the present invention, even though the microwave power is lower than that used in the prior art ion shower apparatus, a high ion current density can be attained. Even at a relatively low voltage of 300 V, the practical ion current density of 1 mA/cm$^3$ was obtained. The reason is that the space between two electrodes or grids in accordance with Child's law can be simulated by the thickness of the plasma sheath. That is, the effects of the present invention are similar to those which can be attained when the spacing between the two electrodes or grids is extremely narrowed. Furthermore, the effects of the present invention can be attained by the ion convergence due to the shape of the plasma sheath. According to the present invention, even under the conditions that a high ion current density more than 2.5 mA/cm$^3$ can be obtained, there is no damage observed to the ion extraction electrode or grid.

When the ion extraction grid with the insulating film is combined with the shield grid, reliability can be improved. However, if the insulating film on the ion extraction grid has defects such as pin holes, so that the electric field produced by the ion extraction grids is extended to the plasma formation chamber, an abnormal discharge (spark-over) may be caused by such defects. As a result, the generation of plasma becomes unstable and the reliability drops.

In order to improve the reliability in operation, the shield grid must be so disposed that the electric field produced by the ion extraction grid is locally confined between the ion extraction grid and the shield grid. That is, even if the insulating film has some defects such as pin holes so that a part of the ion extraction grid is exposed to the plasma, an abnormal discharge and adverse effects on the plasma formation chamber by the electric field can be avoided, whereby a shower-like ion beam can be obtained stably.

FIG. 16 shows a fourth embodiment of the present invention in which the present invention is applied to an ion source of the type in which plasma is produced by the discharge by means of a thermionic cathode which is known in the art as Kaufman type ion source. Here, the inside structure of the specimen chamber 2 is omitted in order to focus on the structure of the plasma formation chamber 1 and can be constructed as shown in FIG. 4 or 4A.

An ion extraction grid 50 consists of, for example, a conductor plate 52 made of a molybdenum disk having a thickness of 0.5 mm and a diameter of 100 mm and an insulating member 53 of a polyimide film having a to be convex at a given curvature over the entire surface thereof on the side of the plasma formation chamber, the ions are converged in a narrow region in the specimen chamber, so that an ion shower density is easily enhanced. In contrast, if the ion extraction electrode is formed to be concave at a given curvature over the entire surface thereof on the side of the plasma formation chamber, the region that the ion shower is irradiated uniformly can be easily made broader. If only the peripheral portion of the ion extraction electrode is made convex toward the plasma formation chamber, an ion shower density in the periphery of the specimen table can be increased relative to the case where the peripheral portion is not made convex, and accordingly the region that the ion shower is irradiated uniformly is substantially extended.

What is claimed is:

1. An ion shower apparatus comprising:
   a plasma formation chamber in which a plasma is produced so as to produce ions;
   a single ion extraction electrode disposed in one portion of said plasma formation chamber and for extracting said ions from said plasma formation chamber so as to form an ion beam in the form of shower;
   a specimen chamber in which the surface of a specimen is irradiated with said ion beam in the form of shower; and
   a shield electrode disposed in the vicinity of said ion extraction electrode in said plasma formation chamber and spaced apart from the thickness of the plasma sheath produced over said ion extraction electrode, said shield electrode permitting the passage of said plasma therethrough and preventing the electric field produced by said ion extraction electrode substantially from extending to the remaining region of said plasma formation chamber.

2. An ion shower apparatus as claimed in claim 1, wherein said plasma is produced in said plasma formation chamber by means of discharge using a thermionic cathode.

3. An ion shower apparatus as claimed in claim 1, wherein said plasma is produced in said plasma formation chamber by the electron cyclotron resonance excited by microwave.

4. An ion shower apparatus as claimed in claim 1, wherein said ion extraction electrode is made of carbon or silicon.

5. An ion shower apparatus as claimed in claim 1, wherein an insulating member is provided on the surface of said ion extraction electrode, said surface being on the side of said plasma formation chamber.

6. An ion shower apparatus as claimed in claim 2, wherein an insulating member is provided on the surface of said ion extraction electrode, said surface being on the side of said plasma formation chamber.

7. An ion shower apparatus as claimed in claim 3, wherein an insulating member is provided on the surface of said ion extraction electrode, said surface being on the side of said plasma formation chamber.

8. An ion shower apparatus as claimed in claim 4, wherein an insulating member is provided on the surface of said ion extraction electrode, said surface being on the side of said plasma formation chamber.

9. An ion shower apparatus comprising:
   a plasma formation chamber in which a plasma is produced by the electron cyclotron resonance excited by microwave so as to produce ions;
   an ion extraction electrode disposed in one portion of said plasma formation chamber and for extracting said ions from said plasma formation chamber so as to form an ion beam in the form of shower;
   an insulating member provided on the surface of said ion extraction electrode, said surface being on the side of said plasma formation chamber; and
   a specimen formation chamber in which the surface of a specimen is irradiated with said ion beam in the form of shower.

* * * * *